(12) United States Patent
Davis et al.

(10) Patent No.: US 11,720,251 B2
(45) Date of Patent: Aug. 8, 2023

(54) GENERATING COMPRESSED REPRESENTATIONS OF SORTED ARRAYS OF IDENTIFIERS

(71) Applicant: EMC IP Holding Company LLC, Hopkinton, MA (US)

(72) Inventors: Sashka T. Davis, Vienna, VA (US); Kevin J. Arunski, Sterling, VA (US)

(73) Assignee: EMC IP Holding Company LLC, Hopkinton, MA (US)

(*) Notice: Subject to any disclaimer, the term of this patent is extended or adjusted under 35 U.S.C. 154(b) by 874 days.

(21) Appl. No.: 16/518,562

(22) Filed: Jul. 22, 2019

(65) Prior Publication Data
US 2021/0027115 A1 Jan. 28, 2021

(51) Int. Cl.
G06K 9/62 (2022.01)
G06F 3/06 (2006.01)
G06F 18/243 (2023.01)

(52) U.S. Cl.
CPC ............ *G06F 3/0608* (2013.01); *G06F 3/064* (2013.01); *G06F 3/0673* (2013.01); *G06F 18/24323* (2023.01)

(58) Field of Classification Search
None
See application file for complete search history.

(56) References Cited

U.S. PATENT DOCUMENTS

| | | | | |
|---|---|---|---|---|
| 5,263,124 | A * | 11/1993 | Weaver | G06F 18/24323 382/226 |
| 9,779,268 | B1 * | 10/2017 | Colgrove | G06F 21/6227 |
| 10,103,747 | B1 * | 10/2018 | Pasha | H03M 7/30 |
| 2002/0107860 | A1 * | 8/2002 | Gobeille | G06F 16/9027 |
| 2004/0073579 | A1 * | 4/2004 | Snyder | G06F 16/284 |
| 2007/0255748 | A1 * | 11/2007 | Ferragina | G06F 16/9027 707/999.102 |

(Continued)

OTHER PUBLICATIONS

T.H. Cormen et al., "Introduction to Algorithms, Second Edition," MIT Press, 1990, 1203 pages.

(Continued)

*Primary Examiner* — Miya J Cato
*Assistant Examiner* — Pawan Dhingra
(74) *Attorney, Agent, or Firm* — Ryan, Mason & Lewis, LLP

(57) ABSTRACT

A method includes obtaining an array of sorted identifiers to be stored in a designated portion of a memory of a given computing system, determining a segment size for splitting elements of the array into a plurality of segments, splitting the array into the plurality of segments based at least in part on the determined segment size, and compressing the plurality of segments to create a plurality of compressed segments. The method also includes generating a balanced binary search tree comprising a plurality of nodes each identifying a range of elements of the array corresponding to a given one of the segments and comprising a pointer to a given compressed segment corresponding to the given segment. The method further includes maintaining the balanced binary search tree and the compressed segments in the designated portion of the memory, and processing queries to the array utilizing the balanced binary search tree.

20 Claims, 8 Drawing Sheets

(56) References Cited

U.S. PATENT DOCUMENTS

| | | | |
|---|---|---|---|
| 2014/0164352 A1* | 6/2014 | Denninghoff | H03H 9/25 |
| | | | 707/711 |
| 2016/0034370 A1* | 2/2016 | Nanduri | G06F 3/0614 |
| | | | 714/6.22 |
| 2017/0228643 A1* | 8/2017 | Kurach | G06N 3/044 |

OTHER PUBLICATIONS

Yann Collet, "RealTime Data Compression," http://fastcompression.blogspot.com/, Mar. 15, 2019, 25 pages.

P. Deutsch, "Deflate Compressed Data Format Specification Version 1.3," Network Working Group, Request for Comments: 1951, May 1996, 17 pages.

R. Lenhardt et al., "Gipfeli—High Speed Compression Algorithm," Proceedings of the IEEE Data Compression Conference (DCC), Aug. 10-12, 2012, pp. 109-118.

\* cited by examiner

| Original Array | n1 | n2 | n3 | n4 | n5 | ... |
|---|---|---|---|---|---|---|
| Transformed Array | n1 | n2-n1 | n3-n2 | n4-n3 | n5-n4 | ... |

GENERATING COMPRESSED REPRESENTATIONS OF SORTED ARRAYS OF IDENTIFIERS

FIELD

The field relates generally to information processing, and more particularly to managing data in information processing systems.

BACKGROUND

In various computing systems, data may be stored in physical or main memory, or in a disk or other storage device. The disk or other storage device will typically have read and write access times that are orders of magnitude more expensive, in terms of time, than the physical or main memory. Different processes running on a computing system may utilize different potions of the physical or main memory of the computing system. The portion of the physical or main memory utilized or reserved for a particular process is referred to as the resident memory of that process. The resident memory is an important resource that can affect the execution time of the process. If the amount of memory required by the process is large, the resident memory for that process may become full and data, in the form of pages, may be evicted or flushed from the resident memory to a disk or other storage device.

SUMMARY

Illustrative embodiments provide techniques for compressing sorted arrays of identifiers. Embodiments advantageously reduce the amount of memory that is needed to store a sorted array of identifiers, including sorted arrays of monotonically increasing unique identifiers.

In one embodiment, a method comprises obtaining an array of sorted identifiers to be stored in a designated portion of a memory of a given computing system, determining a segment size for splitting elements of the array of sorted identifiers into a plurality of segments, splitting the array of sorted identifiers into the plurality of segments based at least in part on the determined segment size, and compressing the plurality of segments to create a plurality of compressed segments. The method also comprises generating a balanced binary search tree comprising a plurality of nodes, each of at least a subset of the plurality of nodes (i) identifying a range of elements of the array of sorted identifiers corresponding to a given one of the segments and (ii) comprising a pointer to a given one of the compressed segments corresponding to the given segment. The method further comprises maintaining the balanced binary search tree and the plurality of compressed segments in the designated portion of the memory of the computing system, and processing one or more queries to the array of sorted identifiers utilizing the plurality of nodes of the balanced binary search tree. The method is performed by at least one processing device comprising a processor coupled to a memory.

The processing device may be implemented, for example, in one or more network devices in a computer network, in a security operations center of an enterprise, or in a security analytics system or other type of network security system associated with the computer network or an enterprise.

These and other illustrative embodiments include, without limitation, methods, apparatus, networks, systems and processor-readable storage media.

BRIEF DESCRIPTION OF THE DRAWINGS

FIG. 3 shows a transformation of an array of identifiers in an illustrative embodiment.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Figure 1:
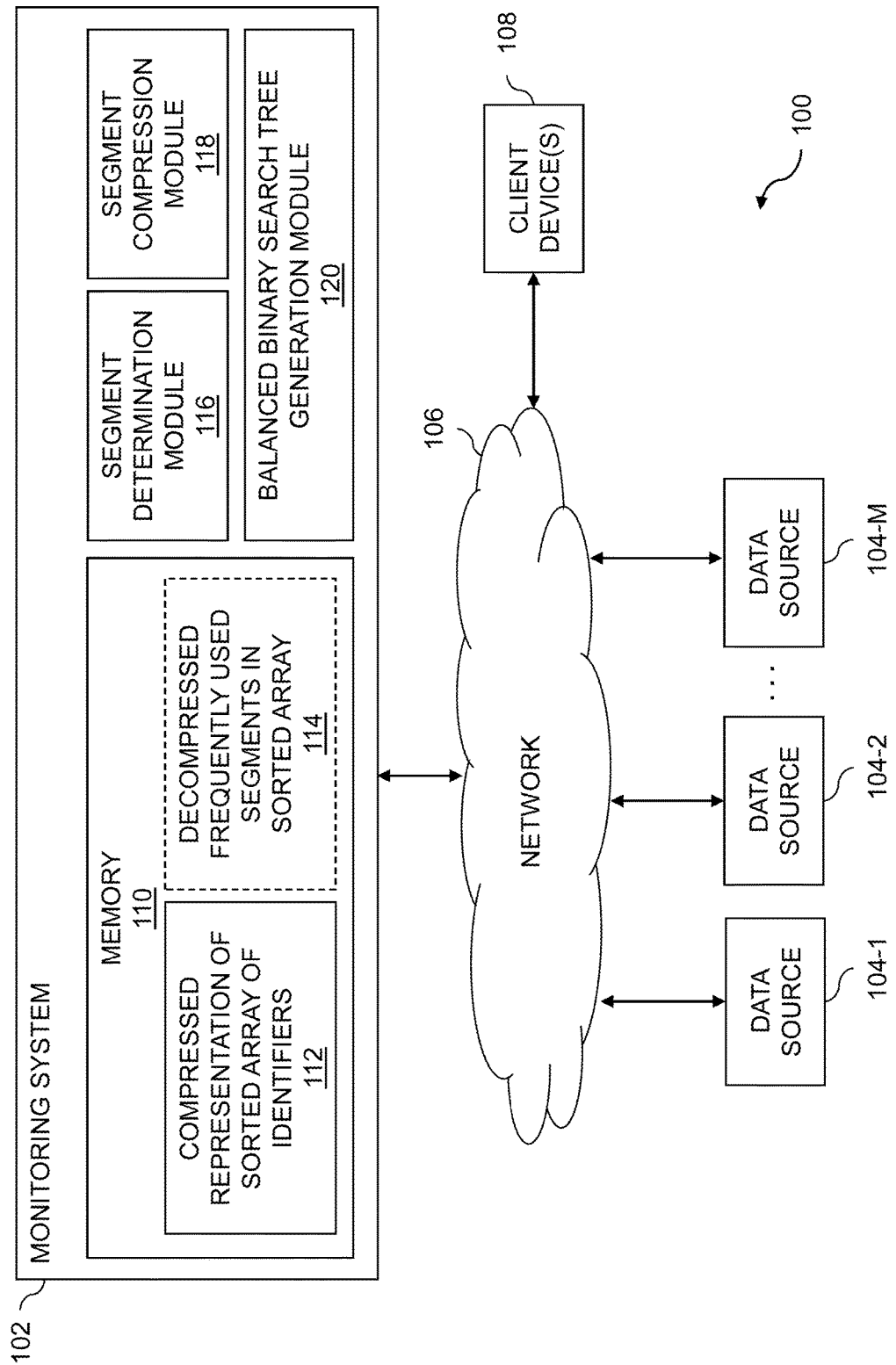
FIG. 1 is a block diagram of an information processing system for compressing sorted arrays of identifiers to be stored in memory of a monitoring system in an illustrative embodiment.

FIG. 1 shows an information processing system 100 configured in accordance with an illustrative embodiment. The information processing system 100 is assumed to be built on at least one processing platform and provides functionality for compressing sorted arrays of identifiers as described in further detail below.

In the FIG. 1 embodiment, a monitoring system 102 receives data from a plurality of data sources 104-1, 104-2, ... 104-M (collectively, data sources 104) over a network 106. The data sources 104 may be respective computing devices, applications or programs running on one or more computing devices, etc.

The network 106 is assumed to comprise a global computer network such as the Internet, although other types of networks can be part of the network 106, including a wide area network (WAN), a local area network (LAN), a satellite network, a telephone or cable network, a cellular network, a wireless network such as a WiFi or WiMAX network, or various portions or combinations of these and other types of networks.

The monitoring system 102 may be part of or comprise an enterprise security operations center (SOC) that monitors an enterprise system comprising a plurality of assets, where the assets provide the data sources 104. The assets of an enterprise system may include, by way of example, physical and virtual computing resources in the enterprise system. Physical computing resources may include physical hardware such as servers, storage systems, networking equipment, Internet of Things (IoT) devices, other types of processing and computing devices, etc. Virtual computing resources may include virtual machines (VMs), containers, etc. The monitoring system 102 may further or alternatively comprise a threat detection and remediation system.

The data sources 104, as noted above, may be physical computing devices or applications running on physical computing devices. Examples of physical computing devices include IoT devices, mobile telephones, laptop computers, tablet computers, desktop computers or other types of devices utilized by members of an enterprise, in any combination. Such devices are examples of what are more generally referred to herein as "processing devices." Some of these processing devices are also generally referred to herein as "computers." The data sources 104 may also or alternatively comprise virtualized computing resources, such as VMs, containers, etc.

The data sources 104 in some embodiments comprise respective physical and/or virtualized computing resources associated with a particular company, organization or other enterprise. In addition, at least portions of the system 100 may also be referred to herein as collectively comprising an "enterprise." Numerous other operating scenarios involving a wide variety of different types and arrangements of processing nodes are possible, as will be appreciated by those skilled in the art.

The data sources 104 may be associated with an enterprise system. The enterprise system may comprise IT infrastructure of an enterprise, including but not limited to physical infrastructure such as a data center, combinations of physical and virtual infrastructure such as a software-defined data center, a cloud computing infrastructure, etc. The plurality of assets may comprise physical or virtual computing resources, such as servers, storage systems, virtual machines, containers, etc.

In some embodiments, the monitoring system 102 provides a SOC or threat detection and remediation system that monitors data sources 104 in one or more enterprise systems for security threats. An example of such a monitoring system is the RSA NetWitness® (RNW) system available from Dell EMC, which may be suitably modified to provide the functionality described herein. The monitoring system 102 may also or alternatively comprise a log concentrator that is configured to obtain network traffic and message logs from data sources 104. The monitoring system 102 may also or alternatively be part of a critical incident response center (CIRC), a security analytics system, a security information and event management (STEM) system, a Governance, Risk and Compliance (GRC) system, etc. More generally, the monitoring system 102 is assumed to comprise or provide a central data repository for data from multiple independent data sources 104.

In some embodiments, the monitoring system 102 generates alerts and notifications that are provided over network 106 to client devices 108, or to a system administrator, information technology (IT) manager, or other authorized personnel via one or more security or host agents. Such security or host agents may be implemented via computing or processing devices associated with a system administrator, IT manager or other authorized personnel. Such devices can illustratively comprise mobile telephones, laptop computers, tablet computers, desktop computers, or other types of computers or processing devices configured for communication over network 106 with the monitoring system 102. For example, a given security or host agent may comprise a mobile telephone equipped with a mobile application configured to receive alerts from the monitoring system 102 and to provide an interface for the security agent to select particular remedial measures for responding to the alert or notification. Examples of such remedial measures may include blocking access by one or more client devices 108 to an enterprise system (e.g., to one or more of the data sources 104 or to assets in the enterprise system that are associated with one or more of the data sources), requiring user input or authentication by the client devices 108 to obtain information from or otherwise utilize one or more assets of the enterprise system, triggering further review of the enterprise system or assets thereof, etc.

It should be noted that a "security agent" or "host agent" as these terms are generally used herein may comprise an automated entity, such as a software entity running on a processing device. Accordingly, a security agent or host agent need not be a human entity.

The monitoring system 102 in the FIG. 1 embodiment is assumed to be implemented using at least one processing device. Each such processing device generally comprises at least one processor and an associated memory, and implements one or more functional modules for controlling certain features of the monitoring system 102. In the FIG. 1 embodiment, the monitoring system 102 includes memory 110, such as random-access memory (RAM). Although not shown, the monitoring system 102 may also include one or more storage devices such as hard disk drives (HDDs), solid state drives (SSDs), etc. In some embodiments, such storage devices are part of a storage system, where the storage system may comprise a storage array such as a scale-out all-flash content addressable storage array such as an XtremIO™ storage array from Dell EMC of Hopkinton, Mass. Other types of storage arrays, including by way of example VNX®, Symmetrix VMAX®, and PowerMAX storage arrays also from Dell EMC, can be used to implement a storage system in other embodiments.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems in illustrative embodiments include all-flash and hybrid flash storage arrays such as Unity™ software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

Although not explicitly shown in FIG. 1, one or more input-output devices such as keyboards, displays or other types of input-output devices may be used to support one or more user interfaces to the monitoring system 102, as well as to support communication between the monitoring system 102 and other related systems and devices not explicitly shown.

The monitoring system 102 further includes a segment determination module 116, a segment compression module 118 and a balanced binary search tree generation module 120.

The monitoring system 102, as discussed above, is configured to receive data from the data sources 104. The obtained data is assumed to be associated with one or more sorted arrays of identifiers (e.g., monotonically increasing arrays of identifiers). Such sorted arrays of identifiers are stored in memory 110 using a compressed representation 112 of the sorted array of identifiers. The memory 110 of the monitoring system 102 may optionally store a cache of decompressed frequently used segments in the sorted array of identifiers, also referred to herein as decompressed cache 114.

An array of sorted identifiers may comprise unique identifiers for network sessions, log events in an enterprise system, etc. The array of sorted identifiers may alternatively provide unique identifiers for caching of database indexes, N-gram indexes, etc. More generally, the array of sorted identifiers comprises elements or items of arbitrary size and type that have an ordering and a comparing mechanism such that a binary search tree can be built and used to locate an item. In various embodiments described herein, it is assumed that the obtained array of sorted identifiers comprises a monotonically increasing sequence of identifiers (e.g., integer values).

The array of sorted identifiers obtained by the monitoring system 102 is to be stored in a designated portion of the memory 110 (e.g., as the compressed representation 112 of the sorted array of identifiers). The segment determination module 116 is configured to determine a segment size for splitting elements of the array of sorted identifiers into a plurality of segments, and to split the array of sorted identifiers into the plurality of segments based at least in part on the determined segment size. The segment compression module 118 is configured to compress the plurality of segments to create a plurality of compressed segments. The balanced binary search tree generation module 120 is configured to generate a balanced binary search tree comprising a plurality of nodes. Each of the plurality of nodes identifies a range of elements of the array of sorted identifiers corresponding to a given one of the segments, and comprises a pointer to a given one of the compressed segments corresponding to the given segment.

The monitoring system 102 maintains the balanced binary search tree and the plurality of compressed segments in the memory 110 as the compressed representation 112. The compressed representation 112 is then used to process queries to the array of sorted identifiers (e.g., received from client devices 108) using the plurality of nodes of the balanced binary search tree.

As noted above, the monitoring system 102 may also provide a decompressed cache 114 for frequently-used ones of the segments in the sorted array of identifiers. The decompressed cache 114 may be built by monitoring access patterns to the plurality of segments of the array of sorted identifiers, and storing in the decompressed cache 114 one or more of the plurality of segments of the array of sorted identifiers in decompressed form. The decompressed segments stored in the cache are selected based on the monitored access patterns (e.g., the most frequently used segments). To monitor the access patterns and determine which segments to keep in the decompressed cache 114, the monitoring system 102 may maintain a counter of usage for respective ones of the plurality of segments, and evict segments from the decompressed cache 114 based at least in part on the maintained usage counters.

The compressed representation 112 stored by the monitoring system 102 may be accessed by one or more client devices 108. The client devices 108, for example, may be operated or utilized by analysts that query elements of the sorted array of identifiers, where the sorted array of identifiers is stored in compressed form as the compressed representation 112.

It is to be appreciated that the particular arrangement of the monitoring system 102, memory 110, compressed representation 112, decompressed cache 114, segment determination module 116, segment compression module 118 and balanced binary search tree generation module 120 illustrated in the FIG. 1 embodiment is presented by way of example only, and alternative arrangements can be used in other embodiments. For example, the functionality associated with the segment determination module 116, the segment compression module 118 and the balanced binary search tree generation module 120 may be combined into one module, or separated across more than three modules with the multiple modules possibly being implemented with multiple distinct processors or processing devices. As another example, in some embodiments the decompressed cache 114 may be omitted.

At least portions of the segment determination module 116, the segment compression module 118 and the balanced binary search tree generation module 120 may be implemented at least in part in the form of software that is stored in memory and executed by a processor. It is to be understood that the particular set of elements shown in FIG. 1 for compressing sorted arrays of identifiers is presented by way of illustrative example only, and in other embodiments additional or alternative elements may be used. Thus, another embodiment may include additional or alternative systems, devices and other network entities, as well as different arrangements of modules and other components.

The monitoring system 102 and other portions of the system 100, as will be described in further detail below, may be part of cloud infrastructure such as an Amazon Web Services (AWS) system. Other examples of cloud-based systems that can be used to provide the monitoring system 102 include Virtustream Enterprise Cloud, Virtustream Storage Cloud, Google Cloud Platform (GCP) and Microsoft Azure.

The monitoring system 102 and other components of the information processing system 100 in the FIG. 1 embodiment are assumed to be implemented using at least one processing platform each comprising one or more processing devices each having a processor coupled to a memory. Such processing devices can illustratively include particular arrangements of compute, storage and network resources.

The monitoring system 102 or components thereof (e.g., the segment determination module 116, the segment compression module 118 and the balanced binary search tree generation module 120) may be implemented on respective distinct processing platforms, although numerous other arrangements are possible. For example, although shown as external to the monitoring system 102 in FIG. 1, one or more of the data sources 104 may be internal to the monitoring system 102 (e.g., an application, program or process that is running on the monitoring system 102).

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the monitoring system 102 and data sources 104 or portions or components thereof, to reside in different data centers. Numerous other distributed implementations are possible. The monitoring system 102 can also be implemented in a distributed manner across multiple data centers.

Additional examples of processing platforms utilized to implement the monitoring system 102 in illustrative embodiments will be described in more detail below in conjunction with FIGS. 7 and 8.

It is to be appreciated that these and other features of illustrative embodiments are presented by way of example only, and should not be construed as limiting in any way.

Figure 2:
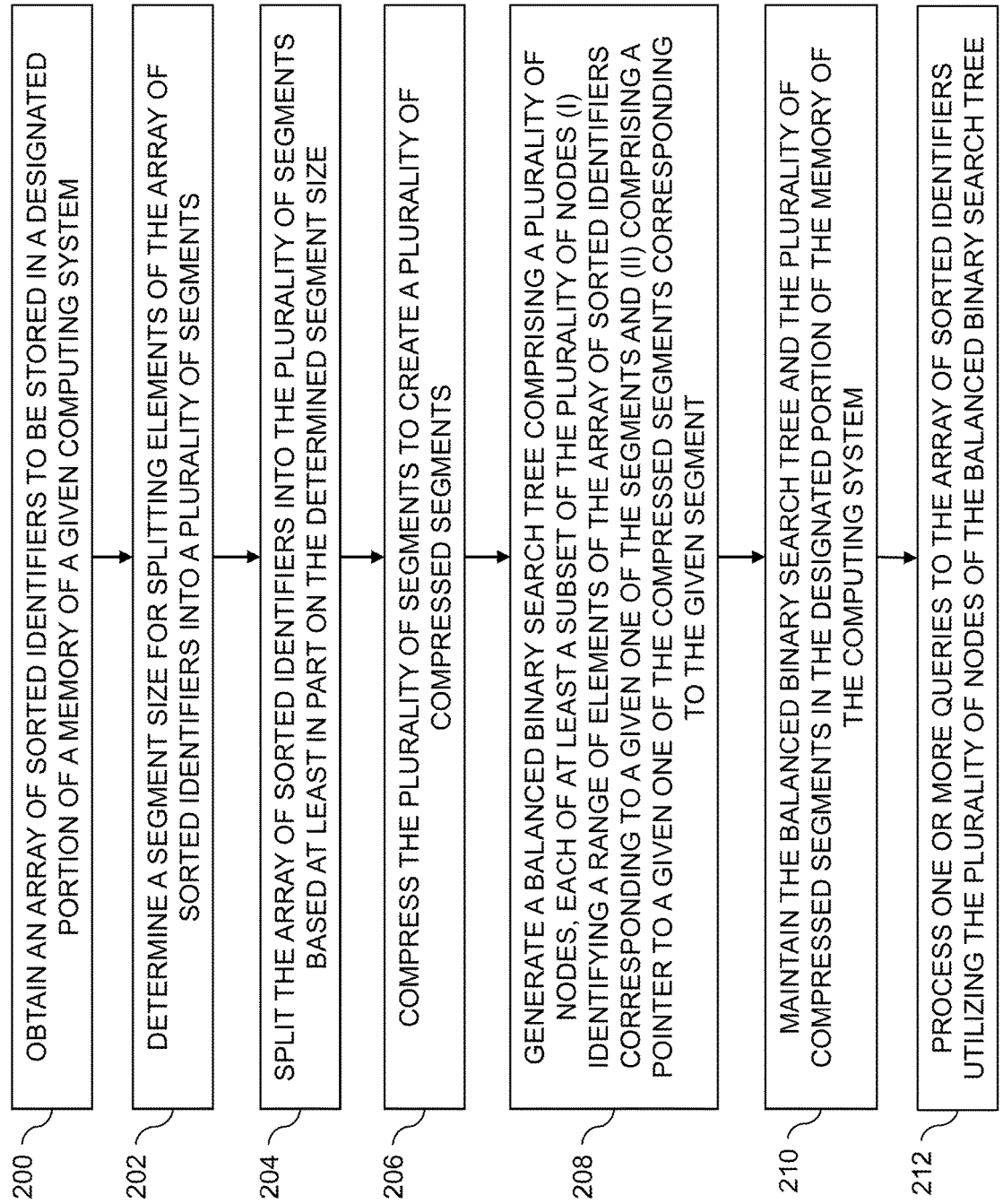
FIG. 2 is a flow diagram of an exemplary process for compression of a sorted array of identifiers in an illustrative embodiment.

An exemplary process for compressing sorted arrays of identifiers will now be described in more detail with reference to the flow diagram of FIG. 2. It is to be understood that this particular process is only an example, and that additional or alternative processes for compressing sorted arrays of identifiers can be carried out in other embodiments.

In this embodiment, the process includes steps 200 through 212. These steps are assumed to be performed by the monitoring system 102 utilizing the segment determination module 116, the segment compression module 118 and the balanced binary search tree generation module 120. The process begins with step 200, obtaining an array of sorted identifiers to be stored in a designated portion of memory of a given computing system. The array of sorted identifiers may comprise a monotonically increasing sequence of unique identifiers, where the monotonically increasing sequence of unique identifiers comprises integer values (e.g., 64-bit integer values).

Elements in the array of sorted identifiers are associated with at least one of network sessions of one or more assets of an enterprise system and log events in the enterprise system. The assets may comprise at least one of physical and virtual computing resources. The array of sorted identifiers may be obtained or generated based on a stream of data from a plurality of data sources that are associated with the assets in the enterprise system monitored by a monitoring system. Elements in the array of sorted identifiers may be associated with respective log messages collected by a log message concentrator. Elements in the array of sorted identifiers may alternatively comprise database indexes, N-gram indexes, and other types of indexes containing monotonically increasing unique identifiers.

In step 202, a segment size is determined for splitting elements of the array of sorted identifiers into a plurality of segments. The segment size (e.g., a number of elements of the array of sorted identifiers) may be determined as a tradeoff between compression ratio and the cost of decompressing segments. Larger segment sizes are generally associated with higher compression ratios, but cost more (e.g., in terms of time and computing resources) to decompress. The array of sorted identifiers is split in step 204 into the plurality of segments based at least in part on the segment size determined in step 202.

The plurality of segments are compressed in step 206 to create a plurality of compressed segments. A compression algorithm utilized to compress the plurality of segments in step 206 may be linear in a size of a given segment K, where $K=O(\log(N))$ and N denotes a size of the array of sorted identifiers. Obtaining the array of sorted identifiers in step 200 may comprise performing a streaming construction of the array of sorted identifiers where the size N of the array of sorted identifiers is unknown, and wherein N is estimated based on a difference between a first and an expected last element of the array of sorted identifiers.

In step 208, a balanced binary search tree is generated. The balanced binary search tree comprises a plurality of nodes. Each of the plurality of nodes identifies a range of elements of the array of sorted identifiers corresponding to a given one of the segments, and comprises a pointer to a given one of the compressed segments corresponding to the given segment. The balanced binary search tree provides logarithmic access time to elements in the array of sorted identifiers. The balanced binary search tree may comprise a Red-Black tree, a self-balanced Adelson-Velsky and Landis (AVL) tree, etc. A root node of the balanced binary search tree may comprise a reference to a current maximum element of the balanced binary search tree to provide constant time streaming append of a new element in the array of sorted identifiers to an existing partially filled segment of the array of sorted identifiers comprising the current maximum element of the balanced binary search tree.

The balanced binary search tree and the plurality of compressed segments are maintained in the designated portion of the memory of the computing device in step 210. Queries to the array of sorted identifiers are processed in step 212 utilizing the plurality of nodes of the balanced binary search tree. In some embodiments, step 210 further comprises providing a set of buffers in the memory of the computing device to permit concurrent access to two or more threads running on the computing system for reading and decompressing two or more different compressed segments of the array of sorted identifiers, each of the set of buffers having a size of M*K, where M is a compression ratio of the compression algorithm utilized to compress the plurality of segments. In an embodiment where elements in the sorted array of identifiers comprise 64-bit integer values, for example, 32 such buffers may be maintained to provide the concurrent access to the two or more threads.

In some embodiments, step 210 further comprises monitoring access patterns to the plurality of segments of the array of sorted identifiers, and storing in the designated portion of the memory a cache of one or more of the plurality of segments of the array of sorted identifiers in decompressed form, the one or more decompressed segments stored in the cache being selected based on the monitored access patterns. Monitoring the access patterns may comprise maintaining a counter of usage of each of the decompressed segments stored in the cache, and evicting decompressed segments stored in the cache based at least in part on the maintained usage counters.

As described above, resident memory is an important resource that can determine the execution time of processes and applications. In some instances, the resident memory limits the capabilities of processes and applications. If the amount of memory required by a process is large, then the execution time may suffer due to paging. Illustrative embodiments provide a data structure that reduces the amount of resident memory required to store large monotonically increasing sequences of identifiers (e.g., integers). Such large, monotonically increasing sequences of identifiers may be generated in an online fashion, such as in caching of database indexes, in N-gram indexes containing monotonically increasing unique identifiers, etc. In some embodiments, the data structure reduces the space requirements for storing sorted arrays of identifiers by 39%.

Various systems assign unique identifiers to data items, such as those associated with network sessions, enterprise log events, etc. Such identifiers may be used to provide search and access to the data items. The unique identifiers may be integers that are assigned to the data items in a monotonically increasing manner in the order of generation or arrival of the data items. As an example, the RNW system assigns unique identifiers to each network session or event log that is processed by a packet decoder and log decoder, respectively. The RNW system may use 64-bit integers as unique identifiers, allowing a database of the RNW system to store and access all user sessions and events without rollover of counters.

To manipulate the data items, it is necessary or useful to keep in resident memory arrays of hundreds of millions of unique identifiers (e.g., which form a monotonically increasing sequence of 64-bit integers). Illustrative embodiments provide techniques for reducing or minimizing the amount of memory that is needed to store large monotonically increasing sequences of identifiers (e.g., generated in streaming fashion) and large sorted arrays of identifiers. As noted above, the identifiers may be integers. The reduction in the amount of memory needed for such tasks comes at the cost of a slight increase in the random-access time for accessing the data. Once the in-memory data structure is created, it may be used concurrently by multiple processes and threads on a computer system. This provides various benefits, increasing the amount of parallelism afforded to even completely sequential programs. Further, the techniques described herein increase the amount of resident memory available at no extra hardware cost. This speeds up processes that manipulate large sorted (e.g., monotonically increasing) arrays of identifiers.

The RNW engine is an example of a monitoring system that manipulates in-memory index arrays, which are in the form of sorted arrays of integers. The RNW database, for example, holds in memory a cache of database record identifiers. These identifiers have a number of properties, including: (i) the identifiers form monotonically increasing arrays of 64-bit integers, and are fairly large (e.g., in the range of tens to hundreds of millions of unique identifiers); and (ii) the size of the array may not be known in advance, and the maximum element of the array may also not be known in advance (e.g., the array is generated online, in streaming fashion as the RNW engine operates). Further, the RNW engine may maintain N-gram indexes of records to implement free-text search. The N-gram indexes may be in the form of arrays of monotonically increasing integers (e.g., the unique identifiers of records are assigned incrementally). Reducing the memory footprint of the RNW engine results in increased speed of operation, and the improved memory utilization results in decreased cost (e.g., reduced memory requirements).

As described above, integers (e.g., 64-bit integers) may be used as unique identifiers for various types of data items to prevent rollover. As the integers are often assigned in a monotonically increasing fashion, resulting database indexes and results sets of search queries are sorted arrays of 64-bit integers.

It should be noted that although various embodiments are described herein with respect to the use of 64-bit integers as unique identifiers, it should be appreciated that this is not a requirement. For example, depending on the expected size of the array, different types of integers may be used, such as 32-bit integers, 128-bit integers, etc. More generally, any monotonically increasing sequence of arbitrary precision integers may be used and will benefit from use of the techniques described herein. Still further, embodiments are not limited solely to cases where the identifiers in the array are integers. The techniques described herein may be used to compress other types of arrays of identifiers where the identifiers or data items are of arbitrary size and type so long as there is an ordering and comparing mechanism for the data items such that a binary search tree can be built and used to locate the data items.

One approach for decreasing the resident memory footprint of such an array of integers is to transform the original array as illustrated in table 300 of FIG. 3. The table 300 shows an original array including data elements denoted n1, n2, n3, n4, n5, etc. The table 300 also shows a transformed array, which keeps the difference between pairs of adjacent elements rather than the elements themselves. Thus, the transformed array includes data elements n1, n2-n1, n3-n2, n4-n3, n5-n4, etc. This solution reduces the memory footprint, exploiting the fact that the number of bits required to store the difference between two consecutive elements is much smaller than the elements themselves (e.g., 64-bit integers, as many of the high order bytes are the same for consecutive elements of the array). This solution thus provides reduction of the memory required, at the price of an increased cost to access an arbitrary element of the array. While a sorted array of size N provides O(log(N)) access to an element in the array, this solution requires O(N) on average to access any element. For example, to access the identifier or element at a position K, all elements in positions 1 through K must be added to find the identifier stored at position K.

Another approach is to use hash tables, which deliver constant access to an arbitrary element of the array. In hash table approaches, however, it is difficult or not possible to reduce the associated memory footprint. Hash table approaches also suffer when the size of the array is not known in advance. Hash table saturation will also cause chaining, resulting in slower access time. O(1) access time is only guaranteed when the hash table is approximately 75-80% full, therefore resulting in wasted space.

Illustrative embodiments provide a data structure that decreases the amount of memory required to store an array of identifiers (e.g., by approximately 39% in some embodiments), while maintaining logarithmic access to any element in the array of identifiers. Once the data structure is built, it can be used concurrently by multiple processes and threads while preserving the smaller memory footprint than would otherwise be required.

In some embodiments, techniques for building the data structure utilize a balanced binary search tree together with fast compression of segments of an array of identifiers. The solution provides for streaming construction of the data structure, with a constant time for append operations (e.g., when the sequence of identifiers is generated online). Further, the solution provides logarithmic time for locating an element, and provides for efficient merging of two structures (e.g., linear in the size of the structures).

Figure 4:
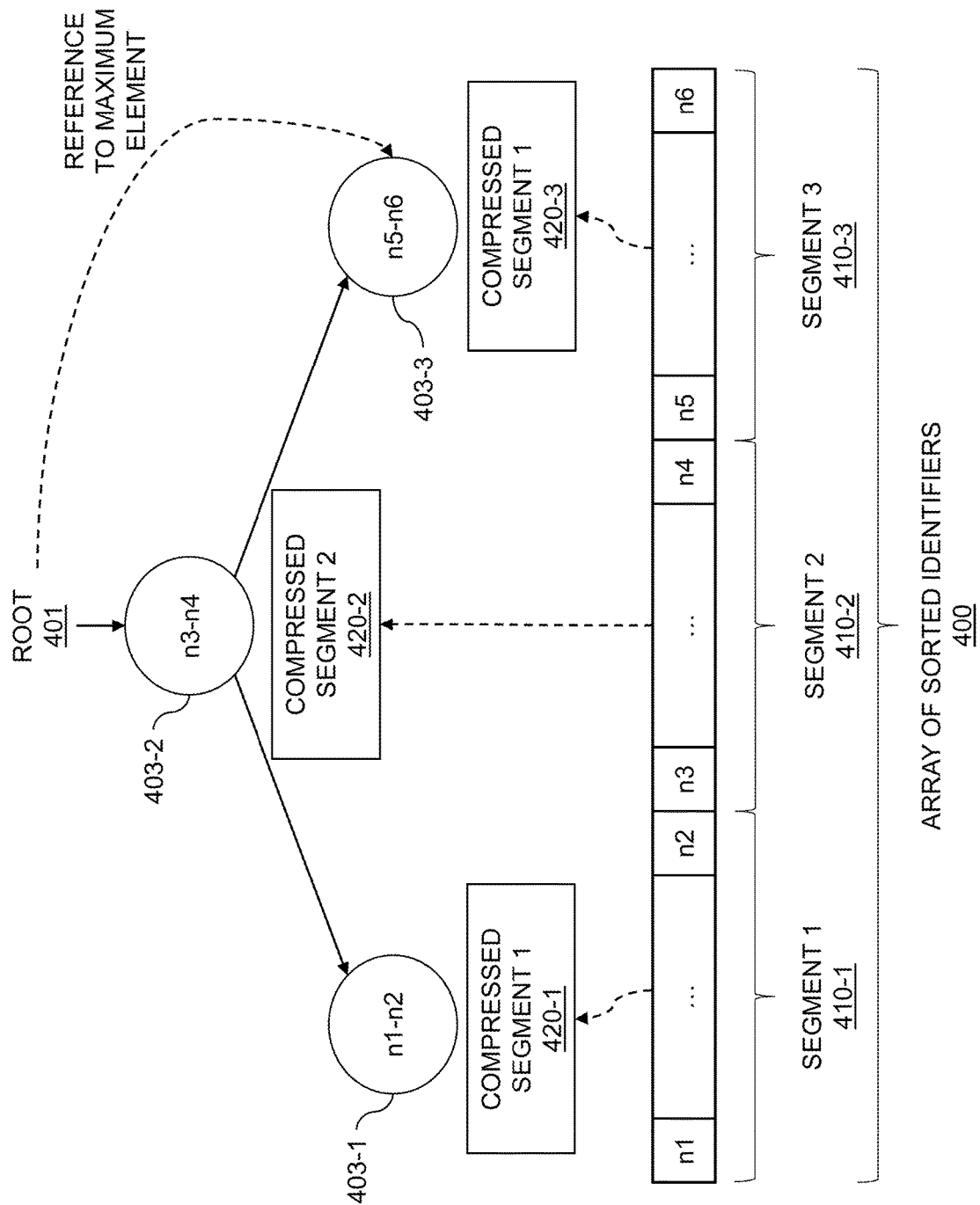
FIG. 4 shows a balanced binary search tree with compressed segments for a sorted array of identifiers in an illustrative embodiment.

Various embodiments utilize a balanced binary search tree with compressed segments (BBST-CS). Lossless compression and an augmented balanced binary tree structure are used for storing monotonically increasing arrays of unique identifiers (e.g., large integer values). FIG. 4 illustrates an example of how an array of sorted identifiers 400 may be chunked or separated into three segments 410-1, 410-2 and 410-3 (collectively, segments 410). Each of the segments 410 may be compressed, thus providing compressed segments 420-1, 420-2 and 420-3 (collectively, compressed segments 420). A three-node balanced binary tree, with a root 401 and nodes 403-1, 403-2 and 403-3, can be used to identify for a given search term which segment the desired identifier belongs to.

The circular nodes 403-1, 403-2 and 403-3 shown in FIG. 4 (collectively, nodes 403) each keep a pointer to one of the compressed segments 420 of the array of sorted identifiers 400 to reduce the space consumed by the array of sorted identifiers 400. Each node 403 keeps the range of the associated compressed segment 420 (e.g., the first and last element of the compressed segment). It should be noted that the sizes of the compressed segments 420 may vary. Each of the nodes 403 keeps a range of identifiers in the compressed segment 420 that it refers to (e.g., ni-nj). For example, node 403-1 labeled n1-n2 refers to compressed segment 420-1, node 403-2 labeled n3-n4 refers to compressed segment 420-2, and node 403-3 labeled n5-n6 refers to compressed segment 420-3. The root 401 of the BB ST-CS shown in FIG. 4 has a reference (not shown in FIG. 4) to the maximum element of the BBST-CS (e.g., the right-most element of node 403-3). This allows constant time streaming append of a new element to an existing partially filled segment. The structure is grown and segments appended as needed.

The BBST-CS of FIG. 4 may be implemented as a Red-Black tree, a self-balanced AVL tree, etc. In a Red-Black tree, each node has an extra bit that may be interpreted as its "color" (e.g., red or black). The "color" bits of the nodes in the Red-Black tree are used to provide balancing of the tree during modification thereof (e.g., insertions and deletions). In an AVL tree, the "height" of the sub-trees of any given node in the tree are allowed to differ by at most one, and rebalancing is performed if due to insertions and deletions this property is violated.

The time used by the compression algorithm (e.g., that produces compressed segments 420 from the segments 410) may be selected to be linear in the size of a segment K, such that K=O(log(N)). In some use case scenarios, such as RNW indexes and database records, N may not be known. A rough estimate of the largest element of the array, denoted Max, may be used to give an upper bound on N (e.g., the difference between the first and last element) and a constant approximation of the size enabling the choice of a segment size.

The choice of the compression library used is a factor in the efficiency of the BBST-CS structure, as the speed of compression and the compression ratio are generally inversely proportional to one another. Different compression libraries and algorithms differ greatly in their capabilities. Generally, the faster the compression algorithm the lower the compression ratio. Deflate is a lossless data compression algorithm that uses a combination of Lempel-Ziv LZ77 (or Lempel-Ziv-Storer-Szymanski (LZSS)) and Huffman coding. Deflate has a high compression ratio, but a relatively slow speed of compression as compared with the LZ4 compression algorithm that is a variant of LZ77. LZ4 is a LZ77 byte-oriented lossless compression algorithm, optimized for fast compression and even faster decompression speeds. Some embodiments utilize LZ4 as the compression algorithm for producing the compressed segments 420. It should be appreciated, however, that various other compression algorithms may be used as desired.

Once the BBST-CS structure is built, any number of concurrent threads can read and decompress different segments by adding 32 buffers of size at most M*K, where M is the compression ratio of a given compression algorithm used to produce the compressed segments 420. In the description below, it is assumed that M<3. Further, it should be noted that the selection of 32 buffers is based on the assumption that the elements of the array of sorted identifiers 400 includes 64-bit integers. Different numbers of buffers may be used if the elements of the array of sorted integers 400 have different size.

A particular implementation of the BBST-CS structure will now be described. The BBST-CS structure was implemented with three different compression algorithms: Deflate, LZ4 and Gipfeli. Of these three, Deflate has the best compression ratio but is the slowest compression technique (e.g., by a factor of 3 compared to LZ4). Gipfeli outperforms LZ4 slightly in compression ratio, but is slower than LZ4. In some cases, the speed of compression is crucial and thus evaluation of the BBST-CS structure below is done using LZ4 as the compression algorithm. It should be appreciated, however, that the use of LZ4 is not a requirement and that various other compression algorithms including Deflate, Gipfeli, etc. may be used as desired.

To evaluate the BBST-CS structure using the LZ4 compression algorithm for producing the compressed segments, an array of 8,000,000 monotonically increasing integers was used as the array of sorted identifiers. The baseline is an in-memory "array" that consumes 64,135,168 bytes (B) and took 274 milliseconds (ms) to build in a streaming fashion. Building the array in a streaming fashion may be a requirement for certain implementations, such as for use with the RNW engine that does not necessarily know the true size of the array in advance.

Figure 5:
FIG. 5 shows sizes and times to build a compressed array of identifiers using different segment sizes in an illustrative embodiment.

The segment size was varied, and the compression ratio and time taken to build the BBST-CS is measured. It should be noted that different segment sizes will result in binary search trees of different topologies and depth, but also different compression ratios. The larger the segment size, the higher the compression ratio. The drawback to larger segment sizes, however, is in the cost of decompressing a segment when the data must be read. FIG. 5 shows a table 500 of results for varying segment sizes. Again, the baseline is an uncompressed array used to store 8,000,000 64-bit integers, which uses 64,135,168 B and which takes 274 ms to construct.

For the segment size 3000, the BBST-CS uses 61.2% of the space required by the baseline uncompressed array. The BBST-CS structure with segment size 3000, however, takes 634 ms to build (as compared to 274 ms for the baseline). The advantages of the BBST-CS data structure, however, are illustrated in the following example. Consider an uncompressed array that is forced to use 39 megabytes (MB) of RAM and 24MB of SSD storage. A typical RAM throughput is 10 gigabytes per second (GB/s), and SSD storage may support a throughput of 1000 megabytes per second (MB/s). Building the uncompressed structure using two layers of the memory hierarchy will take at least 930 ms. If hard disk drive (HDD) storage is used rather than SSD to host the remaining 24MB, then the time to build the structure will exceed 7900 ms making the uncompressed structure computationally inefficient. Conversely, the BBST-CS structure can utilize the remaining 38.8% of memory to store a much larger array in resident memory thus improving the running time and reducing paging overhead of segments that do not fit in the resident memory.

Figure 6:
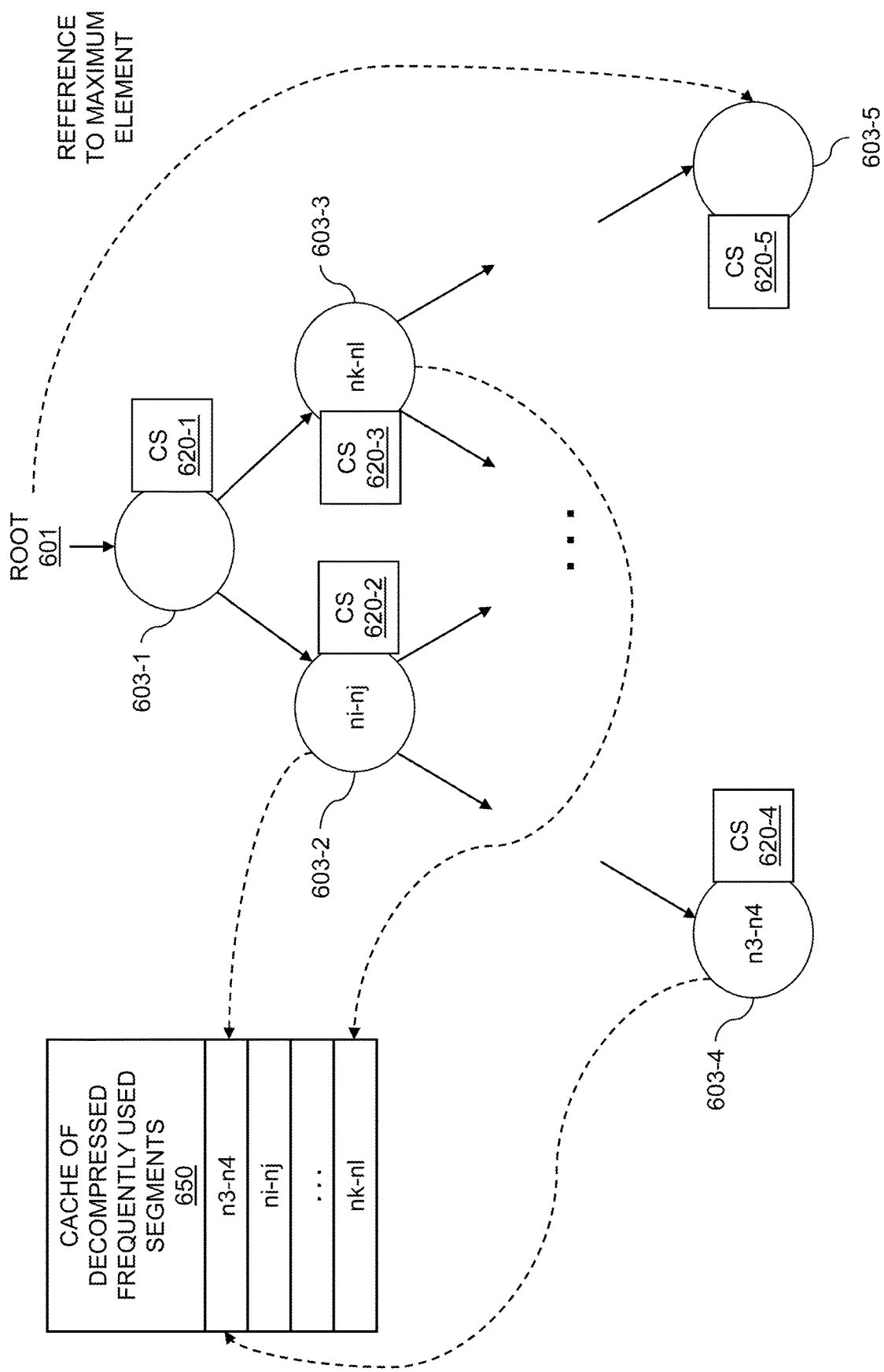
FIG. 6 shows a balanced binary search tree with compressed segments and a cache of decompressed frequently used segments for an array of identifiers in an illustrative embodiment.

In some embodiments, the BB ST-CS structure is augmented with caching of decompressed frequently used segments of the array of sorted identifiers. This is illustrated in FIG. 6, which shows a BBST-CS structure including root 601 and nodes 603-1, 603-2, 603-3, 603-4 and 603-5 (collectively, nodes 603). Similar to the nodes 403, each of the nodes 603 keeps a pointer to a corresponding one of compressed segments 620-1, 620-2, 620-3, 620-4 and 620-5

(collectively, compressed segments (CS) 620). Again, the root 601 contains a reference to the maximum element (e.g., of the right-most node 603-5). In FIG. 6, a cache 650 of decompressed frequently-used segments (e.g., nodes 603-2, 603-3 and 603-4) is maintained in the resident memory. By keeping a small number (e.g., 16, 32, etc.) of frequently-used segments in decompressed form in the cache 650, the cost of decompression is avoided for high usage segments of the array of sorted identifiers.

The cache 650 can be searched in a sequential manner for a hit by comparing if the searched identifier belongs to the range of each decompressed segment. If a decompressed segment is found to be in the cache 650, the BBST-CS structure of FIG. 6 is not searched. Various techniques may be used to determine which segments to keep in decompressed form in the cache 650. In some embodiments, the most recently used segments are kept in the cache 650, which provides a constant overhead of space and the space efficiency of the structure remains the same. In other embodiments, least frequently used (LFU) algorithms may be used for determining which segments to keep in the cache 650. This may require keeping an additional byte per cached segment to keep a counter of the frequency of usage and to implement LFU eviction.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for compressing arrays of identifiers will now be described in greater detail with reference to FIGS. 7 and 8. Although described in the context of system 100, these platforms may also be used to implement at least portions of other information processing systems in other embodiments.

Figure 7:
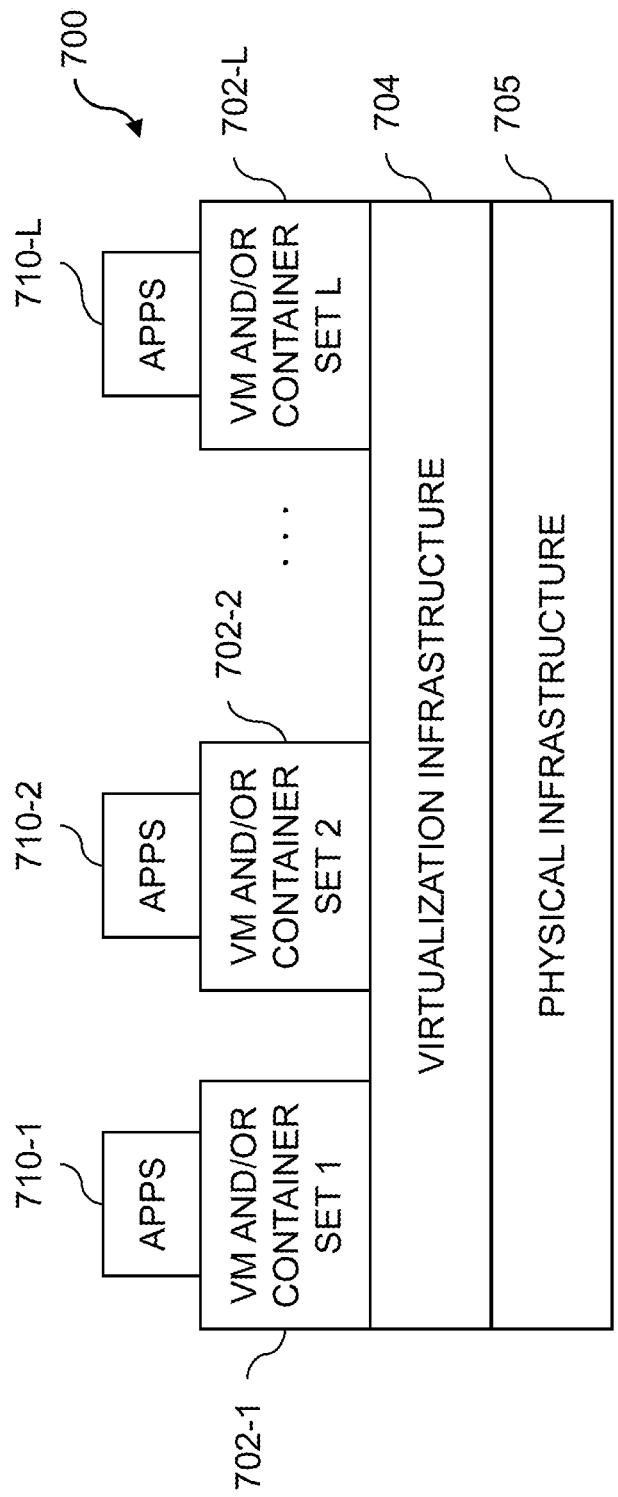
FIGS. 7 and 8 show examples of processing platforms that may be utilized to implement at least a portion of an information processing system in illustrative embodiments.
Figure 8:
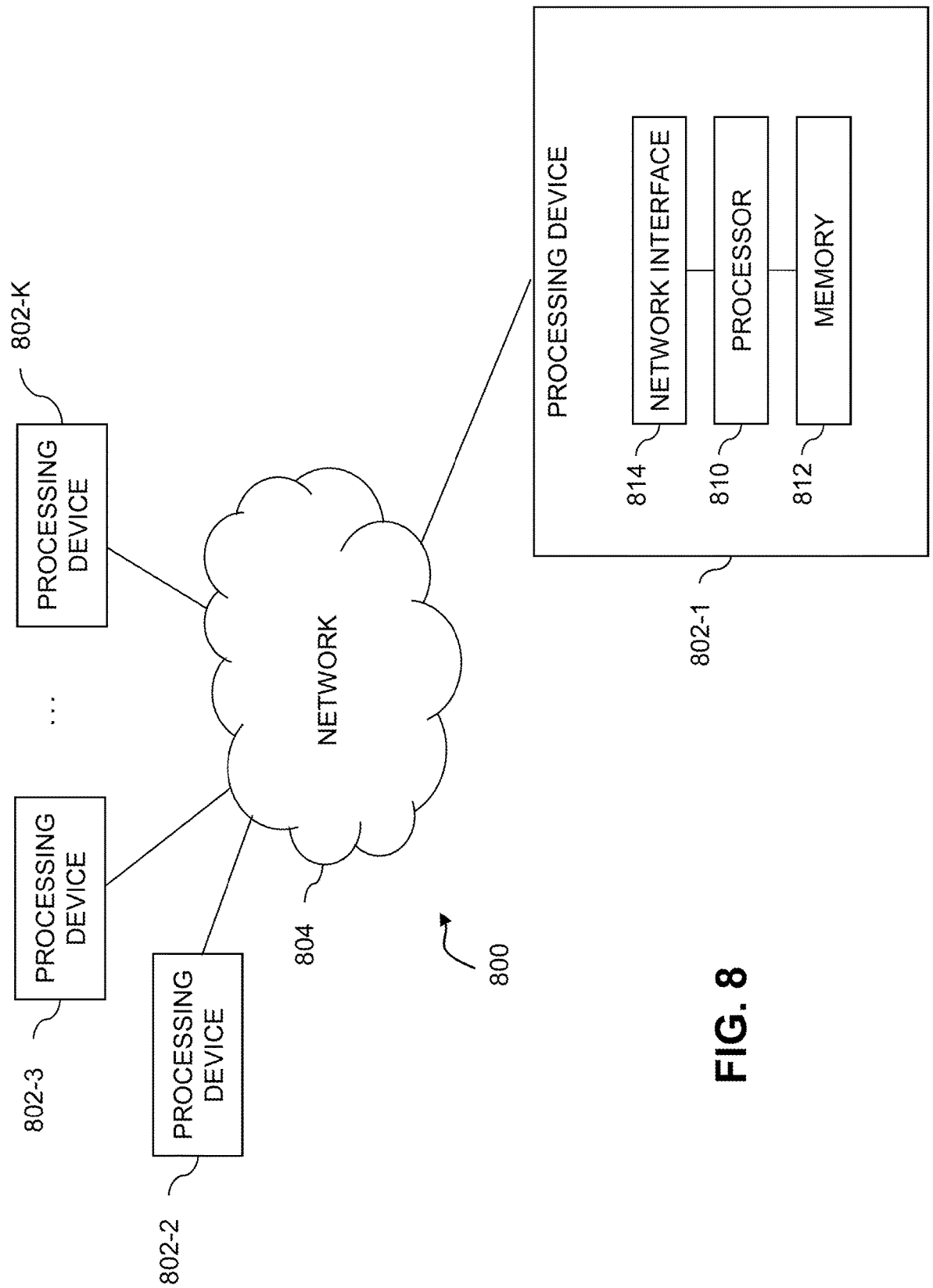

FIG. 7 shows an example processing platform comprising cloud infrastructure 700. The cloud infrastructure 700 comprises a combination of physical and virtual processing resources that may be utilized to implement at least a portion of the information processing system 100. The cloud infrastructure 700 comprises multiple virtual machines (VMs) and/or container sets 702-1, 702-2, . . . 702-L implemented using virtualization infrastructure 704. The virtualization infrastructure 704 runs on physical infrastructure 705, and illustratively comprises one or more hypervisors and/or operating system level virtualization infrastructure. The operating system level virtualization infrastructure illustratively comprises kernel control groups of a Linux operating system or other type of operating system.

The cloud infrastructure 700 further comprises sets of applications 710-1, 710-2, . . . 710-L running on respective ones of the VMs/container sets 702-1, 702-2, . . . 702-L under the control of the virtualization infrastructure 704. The VMs/container sets 702 may comprise respective VMs, respective sets of one or more containers, or respective sets of one or more containers running in VMs.

In some implementations of the FIG. 7 embodiment, the VMs/container sets 702 comprise respective VMs implemented using virtualization infrastructure 704 that comprises at least one hypervisor. An example of a hypervisor platform that may be used to implement a hypervisor within the virtualization infrastructure 704 is the VMware® vSphere® which may have an associated virtual infrastructure management system such as the VMware® vCenter™. The underlying physical machines may comprise one or more distributed processing platforms that include one or more storage systems.

In other implementations of the FIG. 7 embodiment, the VMs/container sets 702 comprise respective containers implemented using virtualization infrastructure 704 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 700 shown in FIG. 7 may represent at least a portion of one processing platform. Another example of such a processing platform is processing platform 800 shown in FIG. 8.

The processing platform 800 in this embodiment comprises a portion of system 100 and includes a plurality of processing devices, denoted 802-1, 802-2, 802-3, . . . 802-K, which communicate with one another over a network 804.

The network 804 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 802-1 in the processing platform 800 comprises a processor 810 coupled to a memory 812.

The processor 810 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 812 may comprise RAM, read-only memory (ROM), flash memory or other types of memory, in any combination. The memory 812 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 802-1 is network interface circuitry 814, which is used to interface the processing device with the network 804 and other system components, and may comprise conventional transceivers.

The other processing devices 802 of the processing platform 800 are assumed to be configured in a manner similar to that shown for processing device 802-1 in the figure.

Again, the particular processing platform 800 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure such as VxRail™, VxRack™, VxRack™ FLEX, VxBlock™ or Vblock® converged infrastructure from Dell EMC.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for compressing arrays of identifiers as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, arrays of identifiers, balanced binary search trees, compression algorithms, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure.

Numerous other alternative embodiments within the scope of the appended claims will be readily apparent to those skilled in the art.

What is claimed is:

1. A method comprising:
   obtaining an array of sorted identifiers to be stored in a designated portion of a memory of a given computing system, wherein the array of sorted identifiers comprises a monotonic sequence of unique identifiers;
   determining a segment size for splitting elements of the array of sorted identifiers into a plurality of segments;
   splitting the array of sorted identifiers into the plurality of segments based at least in part on the determined segment size, the plurality of segments comprising respective ranges of identifiers in the array of sorted identifiers;
   compressing the plurality of segments to create a plurality of compressed segments;
   generating a balanced binary search tree comprising a plurality of nodes, each of at least a subset of the plurality of nodes (i) identifying a range of elements of the array of sorted identifiers corresponding to a given one of the segments and (ii) comprising a pointer to a given one of the compressed segments corresponding to the given segment;
   generating an in-memory data structure comprising the balanced binary search tree and the plurality of compressed segments;
   maintaining the generated in-memory data structure in the designated portion of the memory of the computing system in place of at least a portion of the array of sorted identifiers; and
   processing one or more queries to the array of sorted identifiers utilizing the plurality of nodes of the balanced binary search tree;
   wherein the method is performed by at least one processing device comprising a processor coupled to a memory.

2. The method of claim 1 wherein the monotonic sequence of unique identifiers comprises a monotonically increasing sequence of unique identifiers.

3. The method of claim 2 wherein the monotonically increasing sequence of unique identifiers comprises integer values.

4. The method of claim 3 wherein the integer values comprise 64-bit integer values.

5. The method of claim 1 wherein elements in the array of sorted identifiers are associated with at least one of network sessions of one or more assets of an enterprise system and log events in the enterprise system.

6. The method of claim 1 wherein elements in the array of sorted identifiers comprise at least one of database indexes and N-gram indexes.

7. The method of claim 1 wherein the balanced binary search tree provides logarithmic access time to elements in the array of sorted identifiers.

8. The method of claim 7 wherein the balanced binary search tree comprises one of a Red-Black tree and a self-balanced Adelson-Velsky and Landis (AVL) tree.

9. The method of claim 7 wherein a compression algorithm utilized to compress the plurality of segments is linear in a size of a given segment K, where $K=O(\log(N))$ and N denotes a size of the array of sorted identifiers.

10. The method of claim 9 wherein obtaining the array of sorted identifiers comprises performing a streaming construction of the array of sorted identifiers where the size N of the array of sorted identifiers is unknown, and wherein N is estimated based on a difference between a first and an expected last element of the array of sorted identifiers.

11. The method of claim 9 further comprising providing a set of buffers in the memory of the computing device to permit concurrent access to two or more threads running on the computing system for reading and decompressing two or more different compressed segments of the array of sorted identifiers, each of the set of buffers having a size of M*K, where M is a compression ratio of the compression algorithm utilized to compress the plurality of segments.

12. The method of claim 9 wherein a root node of the balanced binary search tree comprises a reference to a current maximum element of the balanced binary search tree to provide constant time streaming append of a new element in the array of sorted identifiers to an existing partially filled segment of the array of sorted identifiers comprising the current maximum element of the balanced binary search tree.

13. A method comprising:
   obtaining an array of sorted identifiers to be stored in a designated portion of a memory of a given computing system;
   determining a segment size for splitting elements of the array of sorted identifiers into a plurality of segments;

splitting the array of sorted identifiers into the plurality of segments based at least in part on the determined segment size;
compressing the plurality of segments to create a plurality of compressed segments;
generating a balanced binary search tree comprising a plurality of nodes, each of at least a subset of the plurality of nodes (i) identifying a range of elements of the array of sorted identifiers corresponding to a given one of the segments and (ii) comprising a pointer to a given one of the compressed segments corresponding to the given segment;
maintaining the balanced binary search tree and the plurality of compressed segments in the designated portion of the memory of the computing system;
processing one or more queries to the array of sorted identifiers utilizing the plurality of nodes of the balanced binary search tree;
monitoring access patterns to the plurality of segments of the array of sorted identifiers; and
storing in the designated portion of the memory a cache of one or more of the plurality of segments of the array of sorted identifiers in decompressed form, the one or more decompressed segments stored in the cache being selected based on the monitored access patterns;
wherein the method is performed by at least one processing device comprising a processor coupled to a memory.

14. The method of claim 13 wherein monitoring the access patterns comprises maintaining a counter of usage of each of the decompressed segments stored in the cache, and evicting decompressed segments stored in the cache based at least in part on the maintained usage counters.

15. A computer program product comprising a non-transitory processor-readable storage medium having stored therein program code of one or more software programs, wherein the program code when executed by at least one processing device causes the at least one processing device:
to obtain an array of sorted identifiers to be stored in a designated portion of a memory of a given computing system, wherein the array of sorted identifiers comprises a monotonic sequence of unique identifiers;
to determine a segment size for splitting elements of the array of sorted identifiers into a plurality of segments;
to split the array of sorted identifiers into the plurality of segments based at least in part on the determined segment size, the plurality of segments comprising respective ranges of identifiers in the array of sorted identifiers;
to compress the plurality of segments to create a plurality of compressed segments;
to generate a balanced binary search tree comprising a plurality of nodes, each of at least a subset of the plurality of nodes (i) identifying a range of elements of the array of sorted identifiers corresponding to a given one of the segments and (ii) comprising a pointer to a given one of the compressed segments corresponding to the given segment;
to generate an in-memory data structure comprising the balanced binary search tree and the plurality of compressed segments;
to maintain the generated in-memory data structure in the designated portion of the memory of the computing system in place of at least a portion of the array of sorted identifiers; and
to process one or more queries to the array of sorted identifiers utilizing the plurality of nodes of the balanced binary search tree.

16. The computer program product of claim 15 wherein the monotonic sequence of unique identifiers comprises a monotonically increasing sequence of unique identifiers, the monotonically increasing sequence of unique identifiers comprises integer values.

17. The computer program product of claim 15 wherein the program code when executed further causes the at least one processing device:
to monitor access patterns to the plurality of segments of the array of sorted identifiers; and
to store in the designated portion of the memory a cache of one or more of the plurality of segments of the array of sorted identifiers in decompressed form, the one or more decompressed segments stored in the cache being selected based on the monitored access patterns.

18. An apparatus comprising:
at least one processing device comprising a processor coupled to a memory;
the at least one processing device being configured:
to obtain an array of sorted identifiers to be stored in a designated portion of a memory of a given computing system, wherein the array of sorted identifiers comprises a monotonic sequence of unique identifiers;
to determine a segment size for splitting elements of the array of sorted identifiers into a plurality of segments;
to split the array of sorted identifiers into the plurality of segments based at least in part on the determined segment size, the plurality of segments comprising respective ranges of identifiers in the array of sorted identifiers;
to compress the plurality of segments to create a plurality of compressed segments;
to generate a balanced binary search tree comprising a plurality of nodes, each of at least a subset of the plurality of nodes (i) identifying a range of elements of the array of sorted identifiers corresponding to a given one of the segments and (ii) comprising a pointer to a given one of the compressed segments corresponding to the given segment;
to generate an in-memory data structure comprising the balanced binary search tree and the plurality of compressed segments;
to maintain the generated in-memory data structure in the designated portion of the memory of the computing system in place of at least a portion of the array of sorted identifiers; and
to process one or more queries to the array of sorted identifiers utilizing the plurality of nodes of the balanced binary search tree.

19. The apparatus of claim 18 wherein the monotonic sequence of unique identifiers comprises a monotonically increasing sequence of unique identifiers, the monotonically increasing sequence of unique identifiers comprises integer values.

20. The apparatus of claim 18 wherein the at least one processing device is further configured:
to monitor access patterns to the plurality of segments of the array of sorted identifiers; and to store in the designated portion of the memory a cache of one or more of the plurality of segments of the array of sorted identifiers in decompressed form, the one or more decompressed segments stored in the cache being selected based on the monitored access patterns.

* * * * *